(12) United States Patent
Byeon

(10) Patent No.: US 9,385,693 B2
(45) Date of Patent: Jul. 5, 2016

(54) FLIP-FLOP CIRCUIT AND SEMICONDUCTOR APPARATUS USING THE SAME

(71) Applicant: SK hynix Inc., Icheon-si Gyeonggi-do (KR)

(72) Inventor: Sang Jin Byeon, Icheon-si Gyeonngi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 138 days.

(21) Appl. No.: 14/209,520

(22) Filed: Mar. 13, 2014

(65) Prior Publication Data

US 2015/0155857 A1    Jun. 4, 2015

(30) Foreign Application Priority Data

Nov. 29, 2013   (KR) .................. 10-2013-0147744

(51) Int. Cl.
*H03K 3/00* (2006.01)
*H03K 3/037* (2006.01)

(52) U.S. Cl.
CPC .................................. *H03K 3/0375* (2013.01)

(58) Field of Classification Search
CPC ............................ H03K 3/037; H03K 3/0375
USPC ......... 327/199, 208, 210–212, 214, 215, 218, 327/219, 222, 225, 261
See application file for complete search history.

(56) References Cited

U.S. PATENT DOCUMENTS

| | | | | | |
|---|---|---|---|---|---|
| 3,956,700 | A | * | 5/1976 | Condon | H03M 3/022 341/143 |
| 4,203,142 | A | * | 5/1980 | Lee | G01R 27/18 324/509 |
| 4,520,319 | A | * | 5/1985 | Baker | H03L 7/089 327/231 |
| 4,694,291 | A | * | 9/1987 | Denhez | H04L 7/0083 370/503 |
| 4,903,299 | A | * | 2/1990 | Lee | G06F 12/1466 711/154 |
| 5,568,429 | A | * | 10/1996 | D'Souza | H03K 3/0375 327/199 |
| 5,739,710 | A | * | 4/1998 | Baik | H05B 33/0806 327/108 |
| 5,957,988 | A | * | 9/1999 | Osajda | B60R 21/0173 280/735 |
| 7,129,762 | B1 | * | 10/2006 | Vadi | H03K 3/012 327/203 |
| 2005/0184784 | A1 | * | 8/2005 | Washio | G11C 19/00 327/215 |
| 2007/0035338 | A1 | * | 2/2007 | Jung | H03K 3/0372 327/199 |

FOREIGN PATENT DOCUMENTS

WO    2009079749 A1    7/2009

* cited by examiner

*Primary Examiner* — William Hernandez
(74) *Attorney, Agent, or Firm* — William Park & Associates, Ltd.

(57) ABSTRACT

A flip-flop circuit may include: a latch unit configured to latch an input signal in response to a clock signal; and a timing control unit configured to delay a signal provided from the latch unit by a predetermined time regardless of the clock signal.

4 Claims, 11 Drawing Sheets

FLIP-FLOP CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2013-0147744, filed on Nov. 29, 2013, in the Korean Intellectual Property Office, which is incorporated herein by reference in its entirety.

BACKGROUND

1. Technical Field

Various embodiments generally relate to an integrated apparatus, and more particularly, to a flip-flop circuit and a semiconductor apparatus using the same.

2. Related Art

With the increase in capacity and integration degree of semiconductor memory apparatuses, it takes a lot of time to test a semiconductor memory apparatus. Thus, a scan test, a daisy chain test and the like, which are capable of improving test efficiency, may be mainly used.

In order to perform a scan test or daisy chain test, a circuit having flip-flops, for example, D flip-flops coupled in series may be installed in a memory apparatus. In some cases, tens of thousands of D flip-flops may be required for the test.

FIG. 1 is a circuit diagram of a conventional D flip-flop. Wherever possible, the same reference numbers will be used throughout the prior art drawings to refer to the same or like parts.

Referring to FIG. 1, the conventional D flip-flop 1 may have an input unit 11, a driving unit 13, an output unit 15, and a reset unit 17.

The input unit 11 is configured to receive data D in response to clock signals CLK and CLKB. The driving unit 13 is configured to delay a signal outputted through the input unit 11 by a predetermined time in response to the clock signals CLK and CLKB and a reset signal RST, and output the delayed signal. The output unit 15 is configured to output the output signal of the driving unit 13 as output data Q. The reset unit 17 is configured to reset the state of the D flip-flop 1. FIG. 1 also illustrates a power supply voltage VDD.

FIG. 2 illustrates an example of a D flip-flop chain circuit. Referring to FIG. 2, the D flip-flop chain circuit includes a plurality of D flip-flops, for example, n D flip-flops coupled in series (n being a natural number greater than zero).

A first D flip-flop DFF0 is configured to generate output data D1 in response to the reset signal RST, input data D0, and the clock signal CLK. A second D flip-flop DFF1 is configured to generate output data D2 (not shown) in response to the reset signal RST, the output signal D1 of the previous D flip-flop, and the clock signal CLK. Thus, generally speaking, an n-th D flip-flop is configured to generate output data Dn in response to the reset signal RST, an output signal Dn−1 of the previous D flip-flop Dn−1, and the clock signal CLK.

In the D flip-flop chain circuit of FIG. 2, the clock signal CLK is provided to each of the D flip-flops DFF0 to DFFn−1. Thus, the loading of the clock signal CLK inevitably increases.

Output data of flip-flops such as the D flip-flops are changed at a rising or falling edge of the clock signal CLK. Thus, the levels of input data must not be changed at a rising or falling edge of the clock signal CLK. Therefore, a limited time interval during which the input data levels of the flip-flops must not be changed may exist during a predetermined time before and after the rising or falling edge of the clock signal CLK, and may be referred to as a setup time and a hold time. The setup time refers to a minimum time interval during which the input data levels must not be changed, before the rising edge of the clock signal CLK, and the hold time refers to a minimum time interval during which the input data levels must not be changed, after the rising edge of the clock signal CLK.

However, in the D flip-flop chain circuit of FIG. 2, the clock signal CLK has large loading. Thus, while the input data D0 passes through a large number of D flip-flops, the setup characteristic may be degraded to output data at an undesired level.

In order to solve such a problem, a method illustrated in FIGS. 3A and 3B may be configured.

FIGS. 3A and 3B illustrate another example of the conventional D flip-flop chain circuit.

Referring to FIGS. 3A and 3B, it can be seen that clock signals CLK0 to CLKn−1 are delayed by a predetermined time and then repeated and provided to D flip-flops DFF0 to DFFn−1 forming the D flip-flop chain circuit, respectively. That is, as illustrated in FIG. 3B, the clock signals CLK0 to CLKn−2 are delayed by delay circuits DLY0 to DLYn−2, and provided to the respective D flip-flops DFF0 to DFFn−1. In order to reduce the loading of the clock signals CLK0 to CLKn−2, the D flip-flop chain circuit delays the clock signals CLK0 to CLKn−2 by the predetermined time whenever the data D0 to Dn−1 pass through the respective D flip-flops. However, since an excessively large number of delay circuits DLY0 to DLYn−2 may be required to repeat the clock signals CLK0 to CLKn−2, current consumption may be increased.

FIGS. 4A and 4B illustrate another example of the conventional D flip-flop chain circuit.

In order to solve the problem of the D flip-flop chain circuit illustrated in FIGS. 3A and 3B, the D flip-flops are divided into a plurality of groups, and the repeated clock signal CLK0 is provided to D flip-flop groups after a second D flip-flop group. In this example, the number of delay circuits DLY may be decreased to reduce the area and current consumption. However, when the physical distance between adjacent D flip-flops is not constant, a defect may occur in the setup/hold time.

In order to minimize the occurrence of defect in the setup/hold time depending on the physical distance between adjacent D flip-flops, the data and the clock signal may be set to have the same loading. FIGS. 5A and 5B illustrate this method.

That is, a clock signal repeater illustrated in FIG. 5B may be installed in each of the D flip-flops such that the data and clock signal have the same loading. In FIG. 5B, signal CLKBk is an inverted signal of clock signal CLKk, and signal CLKk+1 is an inverted signal of CLKBk.

In this case, however, a hold margin is not secured for D flip-flops after the second D flip-flop DFF1, and a defect may occur.

FIGS. 6A and 6B are timing diagrams of the D flip-flop chain circuit illustrated in FIG. 5.

FIG. 6A is a timing diagram when the D flip-flop circuit normally operates. Referring to FIG. 6A, it can be seen that input data D (i.e., D0 and Dn) is inputted at a high level H, and high-level data are normally outputted from the respective D flip-flops in response to the clock signal CLK.

On the other hand, referring to FIG. 6B, it can be seen that the logical levels of the data are changed at the second D flip-flop and the following D flip-flops, and the data are outputted at a low level L.

As the D flip-flop chain circuit abnormally operates, the reliability of the test result of the semiconductor apparatus inevitably decreases.

FIG. 7 illustrates another example of the conventional D flip-flop circuit.

The D flip-flop circuit 2 illustrated in FIG. 7 includes an input unit 21, a driving unit 23, an output unit 25, and a reset unit 27.

The D flip-flop circuit of FIG. 7 is different from the D flip-flop circuit of FIG. 1 in that inverters of the driving units 13 and 23 and the output units 15 and 25 are driven in response to different clock signals. That is, the D flip-flop circuit 1 of FIG. 1 drives the driving unit 13 and the output unit 15 using the clock signal CLK and an inverted signal CLKB thereof. On the other hand, the D flip-flop circuit 2 of FIG. 7 drives the driving unit 23 and the output unit 25 using a delayed clock signal CLKD and an inverted signal CLKB thereof.

That is, the time at which data is outputted from the output unit 25 may be delayed to reduce a margin defect caused by the loading of the clock signal CLK, thereby securing a hold margin.

However, when skew occurs due to a difference in delay amount between the clock signal CLK and the delayed clock signal CLKD, a direct current may be generated between an input terminal for the delayed clock signal CLKD and an input terminal for the inverted clock signal CLKB in the inverter during a predetermined time.

SUMMARY

In an embodiment of the present disclosure, a flip-flop circuit may include: a latch unit configured to latch an input signal in response to a clock signal; and a timing control unit configured to delay a signal provided from the latch unit by a predetermined time regardless of the clock signal.

In an embodiment of the present disclosure, a flip-flop circuit including an output unit may include: a feedback unit configured to feed back a signal applied to an output node to an input node in response to a clock signal; and a timing control unit configured to delay the signal applied to the input node by a predetermined time regardless of the clock signal, and output the delayed signal to the output node.

In an embodiment of the present disclosure, a semiconductor apparatus may include a plurality of flip-flop circuits coupled in series. Each of the flip-flop circuits may include: a latch unit configured to latch an input signal in response to a clock signal; and a timing control unit configured to delay a signal provided from the latch unit by a predetermined time regardless of the clock signal.

In an embodiment of the present disclosure, a semiconductor apparatus may include a plurality of flip-flop circuits coupled in series, wherein each of the flip-flop circuits may include: an output unit including: a feedback unit configured to feed back a signal applied to an output node to an input node in response to a clock signal; and a timing control unit configured to delay the signal applied to the input node by a predetermined time regardless of the clock signal, and output the delayed signal to the output node.

BRIEF DESCRIPTION OF THE DRAWINGS

Features, aspects, and embodiments are described in conjunction with the attached drawings, in which.

DETAILED DESCRIPTION

Hereinafter, a flip-flop circuit and a semiconductor apparatus using the same according to the present disclosure will be described below with reference to the accompanying drawings through various examples of embodiments. Wherever possible, the same reference numbers/characters will be used throughout the drawings to refer to the same or like parts.

Figure 1:
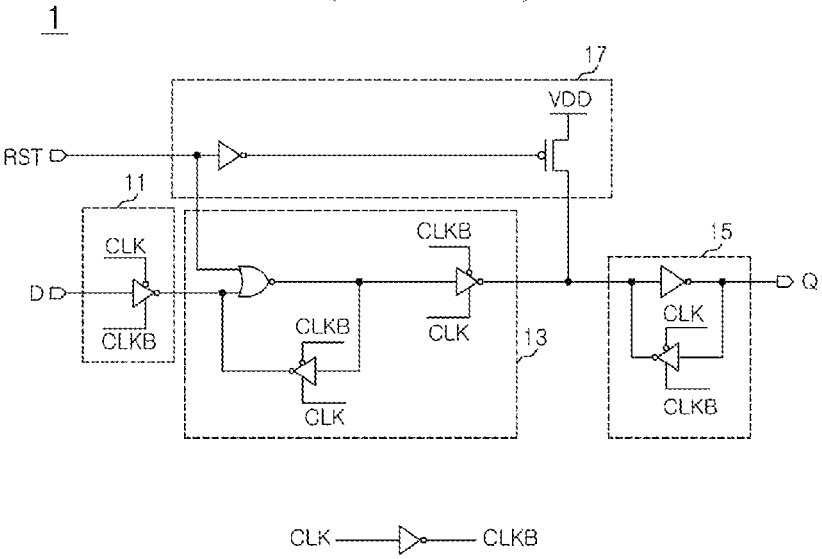
FIG. 1 is a circuit diagram of a conventional D flip-flop.
Figure 2:
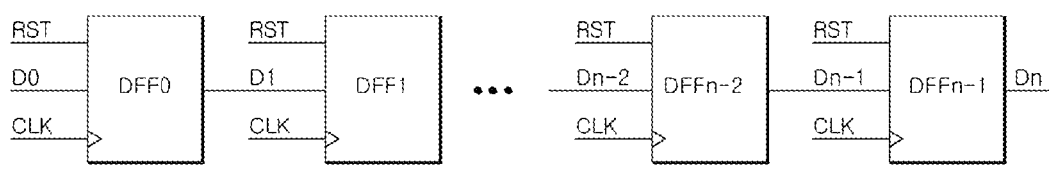
FIG. 2 illustrates an example of a D flip-flop chain circuit.
Figure 3A:
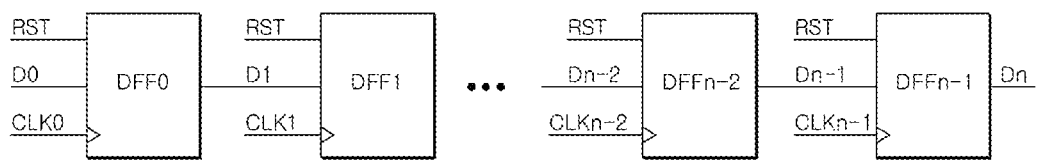
FIGS. 3A and 3B illustrate another example of the conventional D flip-flop chain circuit.
Figure 3B:
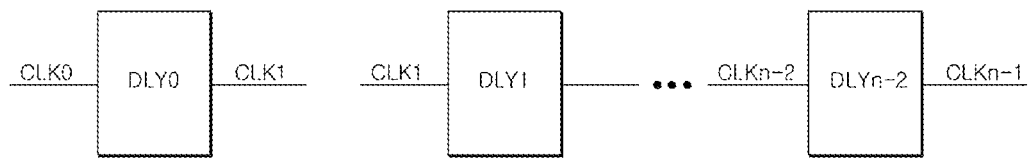
Figure 4A:
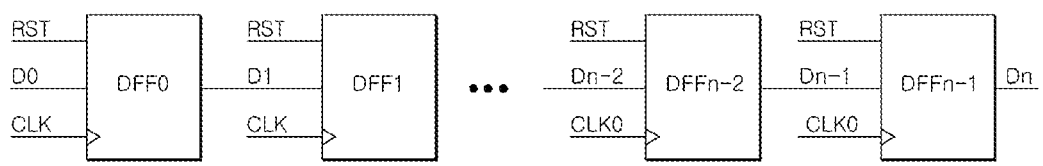
FIGS. 4A and 4B illustrate another example of the conventional D flip-flop chain circuit.
Figure 4B:
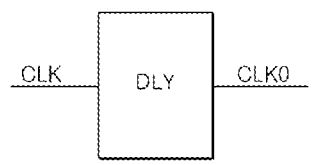
Figure 5A:
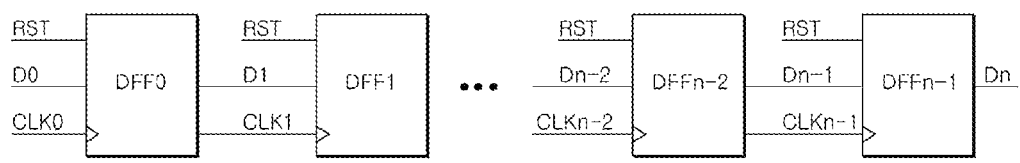
FIGS. 5A and 5B illustrate another example of the conventional D flip-flop chain circuit.
Figure 5B:
Figure 6A:
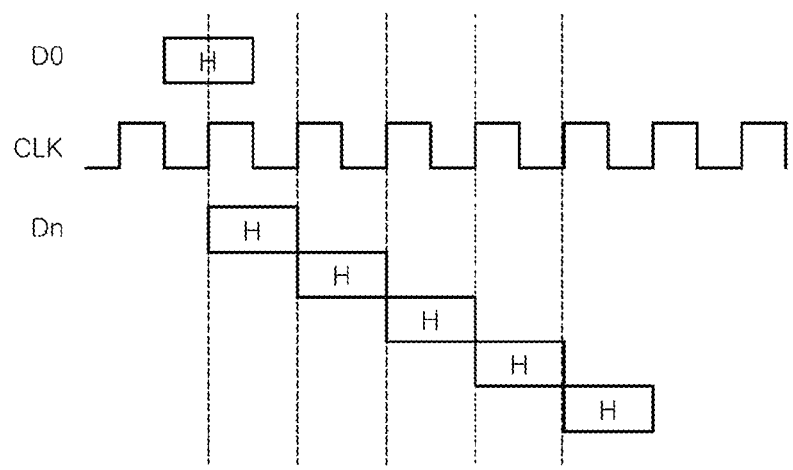
FIGS. 6A and 6B are timing diagrams of the D flip-flop chain circuit illustrated in FIG. 5.
Figure 6B:
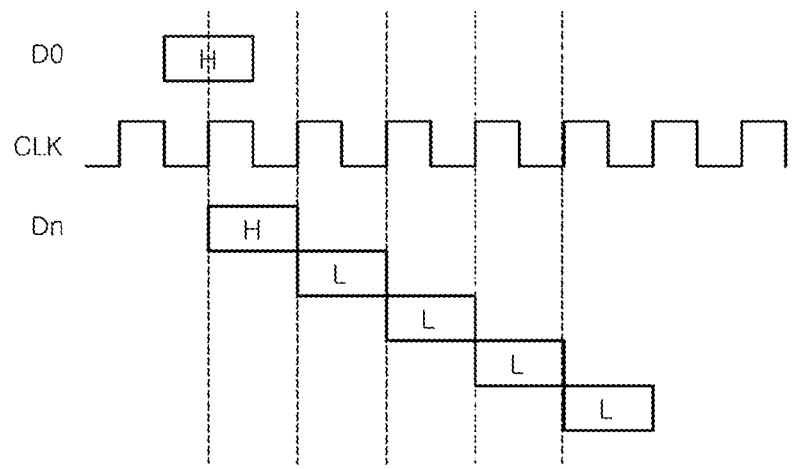
Figure 7:
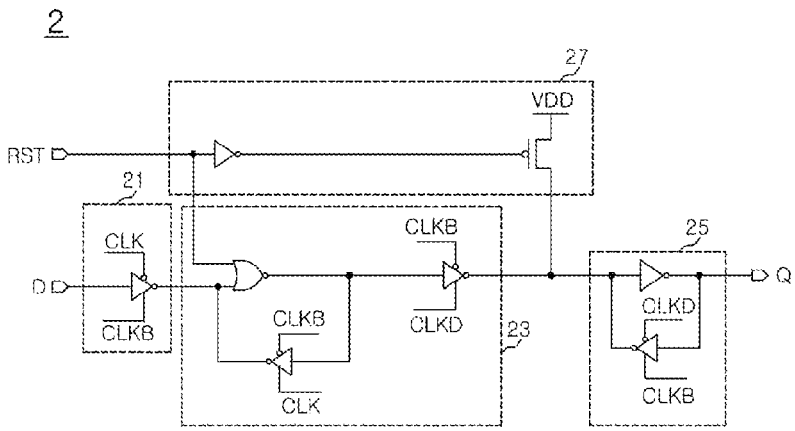
FIG. 7 illustrates another example of the conventional D flip-flop circuit.
Figure 8:
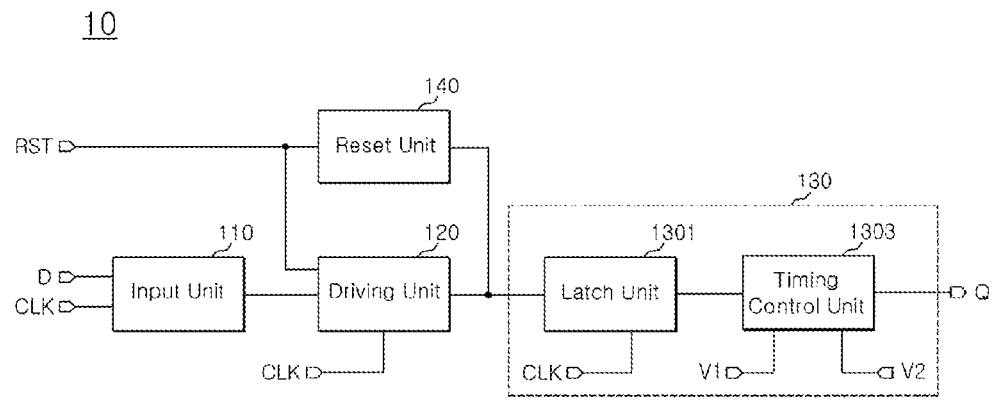
FIG. 8 is a configuration diagram of a flip-flop circuit according to an embodiment of the present disclosure.

FIG. 8 is a configuration diagram of a flip-flop circuit according to an embodiment of the present disclosure.

Referring to FIG. 8, the flip-flop circuit 10 according to the embodiment of the present disclosure may include an input unit 110, a driving unit 120, an output unit 130, and a reset unit 140. The output unit 130 may include a latch unit 1301 and a timing control unit 1303.

The input unit 110 may be configured to receive and latch an input signal D in response to a clock signal CLK. The driving unit 120 may be configured to latch a signal outputted through the input unit 110 in response to the clock signal CLK and a reset signal RST. The output unit 130 may be configured to output a signal provided from the driving unit 120 as output data Q. Specifically, the latch unit 1301 may be configured to temporarily latch the output signal of the driving unit 120, and the timing control unit 1303 may be configured to delay an output signal of the latch unit 1301 and output the delayed signal as the output data Q in response to bias voltages V1 and V2, regardless of the clock signal CLK.

The reset unit 140 may be configured to reset the flip-flop circuit 10 in response to the reset signal RST.

That is, the flip-flop circuit 10 according to an embodiment of the present disclosure does not control the data output timing in response to the clock signal CLK, but controls the data output timing in response to the preset bias voltages V1 and V2. The bias voltages V1 and V2 may include a power supply voltage and a ground voltage, but the present embodiments are not limited thereto. The bias voltages V1 and V2 may include bias voltages generated through a separate bias voltage generation circuit.

The timing control unit 1303 for controlling data output timing in response to the bias voltages V1 and V2 may include one or more MOS transistors or resistance elements.

Figure 9:
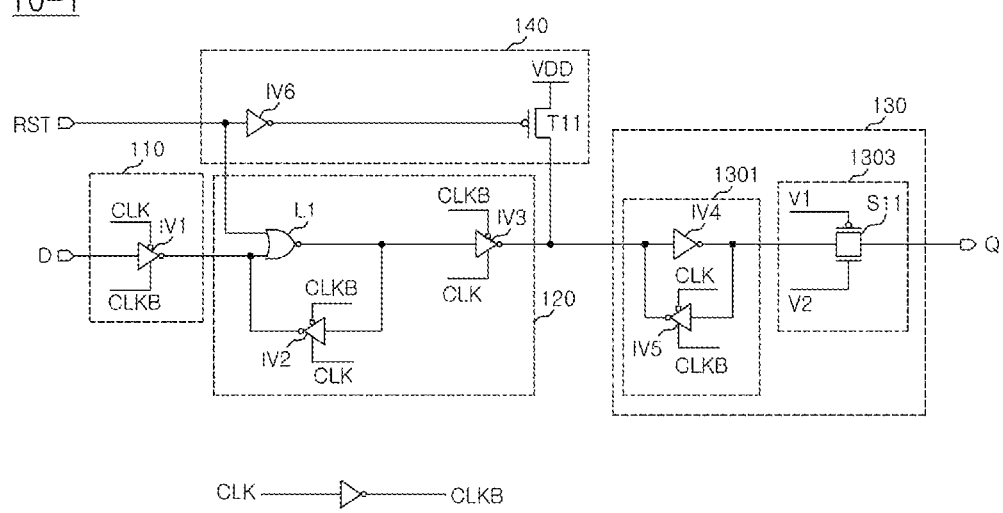
FIG. 9 is a detailed diagram of the flip-flop circuit illustrated in FIG. 8.

FIG. 9 is a detailed diagram of the flip-flop circuit illustrated in FIG. 8.

The input unit 110 may include a first inverter IV1 configured to receive the input data D in response to the clock signals CLK and CLKB. More specifically, the input unit 110 may latch the input data D in synchronization with a first phase of the clock signal CLK.

The driving unit 120 may output an output signal of the input unit 110 in synchronization with a second phase of the clock signal CLK. More specifically, the driving unit 120 may include a logical element L1 configured to invert and output the output signal of the input unit 110 when the reset signal RST is disabled and reset the flip-flop circuit 10-1 when the reset signal RST is enabled, a second inverter IV2 configured to feed back an output signal of the logical element L1 to an input terminal of the logical element L1 in response to the clock signals CLK and CLKB, and a third inverter IV3 configured to invert and output the output signal of the logical element L1 in response to the clock signal CLK and CLKB.

The latch unit 1301 may include a pair of inverters coupled in parallel, that is, fourth and fifth inverters IV4 and IV5. The fourth inverter IV4 may serve as an input terminal of the latch unit 1301. The fifth inverter IV5 may be configured to invert an output signal of the fourth inverter IV4, feed back the inverted signal to the fourth inverter IV4, and output a signal in synchronization with first phases of the clock signals CLK and CLKB.

The timing control unit 1303 may output the signal provided from the latch unit 1301 as the final output signal Q in response to the first and second bias voltages V1 and V2, regardless of the clock signal CLK. FIG. 9 illustrates the timing control unit 1303 including a transmission switching element S11 having a pair of MOS transistors.

The transmission switching element S11 may include a PMOS transistor and an NMOS transistor. Since the PMOS transistor and the NMOS transistor share a source and drain region, the transmission switching element S11 occupies a small area. Furthermore, since the output data are delayed only by the channel resistance values of the PMOS and NMOS transistors, which are coupled in parallel, the transmission switching element S11 has a small delay amount. Thus, a hold time margin may be easily secured.

The first bias voltage may include a ground voltage VSS, and the second bias voltage may include a power supply voltage VDD, for example. However, the present disclosure is not limited thereto.

The reset unit 140 may include a sixth inverter IV6 configured to receive the reset signal RST and invert and output the received reset signal RST and a first switching element T11 driven according to an output signal of the sixth inverter IV6 and coupled between the power supply voltage terminal VDD and an output node of the driving unit 120.

Figure 10:
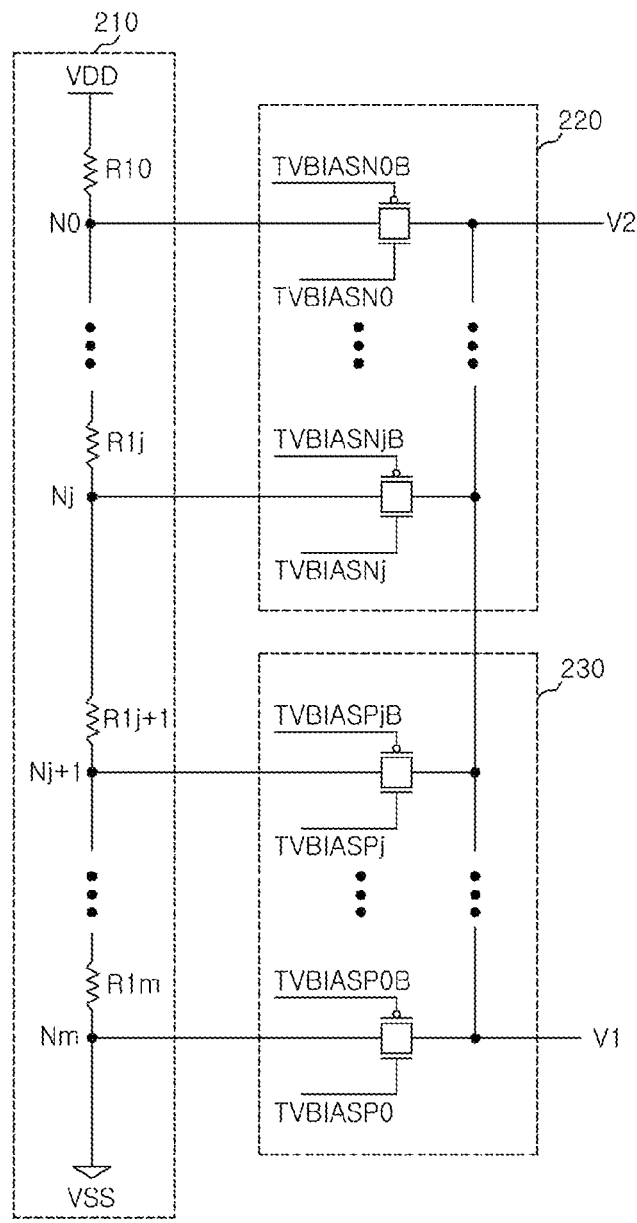
FIG. 10 illustrates a bias voltage generation circuit which is applied to the present disclosure.

FIG. 10 illustrates a bias voltage generation circuit which is applied to the present embodiments.

The bias voltage generation circuit 20 of FIG. 10 may be employed to generate the first and second bias voltages which are to be supplied to the timing control unit 1303.

The bias voltage generation circuit 20 may include a voltage division unit 210, a second bias voltage generation unit 220, and a first bias voltage generation unit 230. The voltage division unit 210 may include a plurality of resistance elements R10 to R1$m$ coupled in series between the power supply voltage VDD terminal and the ground voltage VSS terminal. The second bias voltage generation unit 220 may include a plurality of transmission switching elements coupled in parallel between a second bias voltage output terminal V2 and output nodes (i.e., N0, Nj, Nj+1, and Nm) of $(m+1)/2$ resistance elements R10 to R1$j$ adjacent to the power supply voltage VDD terminal where $j=(m-1)/2$, among output nodes of the resistance elements R10 to R1$m$ of the voltage division unit 210 (where m is a natural number greater than zero). The first bias voltage generation unit 230 may include a plurality of transmission switching elements coupled in parallel between a first bias voltage output terminal V1 and output nodes (i.e., N0, Nj, Nj+1, and Nm) of $(m+1)/2$ resistance elements R1$j$+1 to R1$m$ adjacent to the ground voltage VSS terminal where $j=(m-1)/2$, among the output nodes of the resistance elements R10 to R1$m$ (where m is a natural number greater than zero).

Each of the transmission switching elements forming the first bias voltage generation unit 230 may be driven according to a preset first bias signal TVBIASP, and each of the transmission switching elements forming the second bias voltage generation unit 220 may be driven according to a preset second bias signal TVBIASN.

The bias voltage generation circuit 20 may be configured to be controlled through a mode resistance element set (MRS) or test mode, perform a test, and then control the levels of first bias signals TVBIASP0 (TVBIASP0B) to TVBIASP$j$ (TVBIASP$j$B) for generating the first bias voltage and the levels of second bias signals TVBIASN0 (TVBIASN0B) to TVBIASN$j$ (TVBIASN$j$B) for generating the second bias voltage V2.

That is, according to the first and second bias voltages V1 and V2 generated from the bias voltage generation circuit 20, a test for the flip-flop circuit 10-1 may be performed to control the corresponding bias signals in an electrical fuse programming method, or a controller may change register values to obtain the bias voltages V1 and V2 at a target level.

The bias voltage generation circuit is not limited to the example of FIG. 10, but may include any bias voltage generation circuits as long as they can drive the timing control unit 1303 illustrated in FIG. 9.

Figure 11:
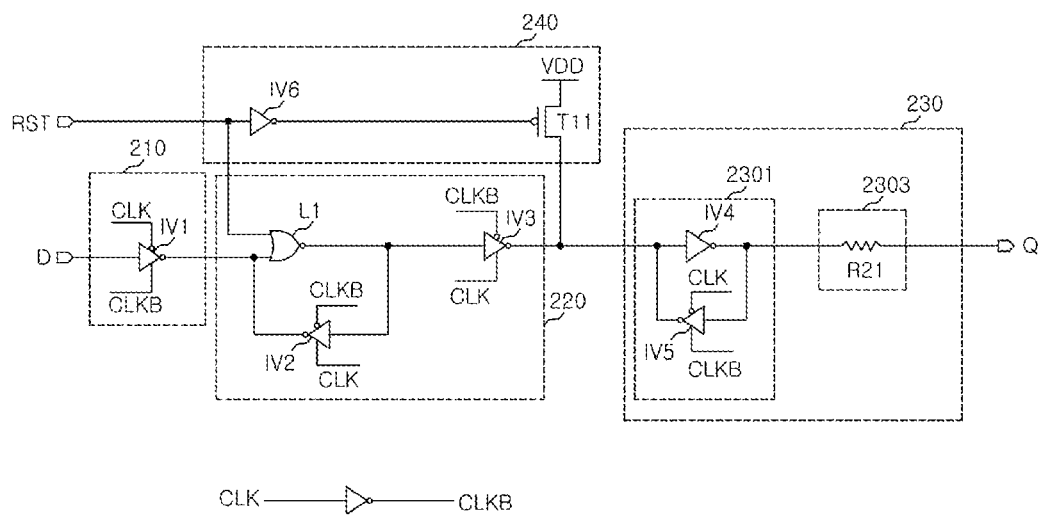
FIG. 11 illustrates an example of the flip-flop circuit according to the embodiment of the present disclosure.

FIG. 11 illustrates an example of a flip-flop circuit according to an embodiment of the present disclosure.

The flip-flop circuit 10-2 illustrated in FIG. 11 may include an input unit 210, a driving unit 220, an output unit 230, and a reset unit 240. The output unit 230 may include a latch unit 2301 and a timing control unit 2303.

The input unit 210, the driving unit 220, the reset unit 240, and the latch unit 2301 have substantially the same configuration as those of the flip-flop circuit illustrated in FIG. 9.

However, the timing control unit 2303 may include a first resistance element R21. The first resistance element R21 may include an active resistor or metal resistor. When the timing control unit 2303 is implemented with the first resistance element R21, all resistance elements included in flip-flop circuits forming the flip-flop chain circuit may be designed to have the same preset resistance value.

Figure 12:
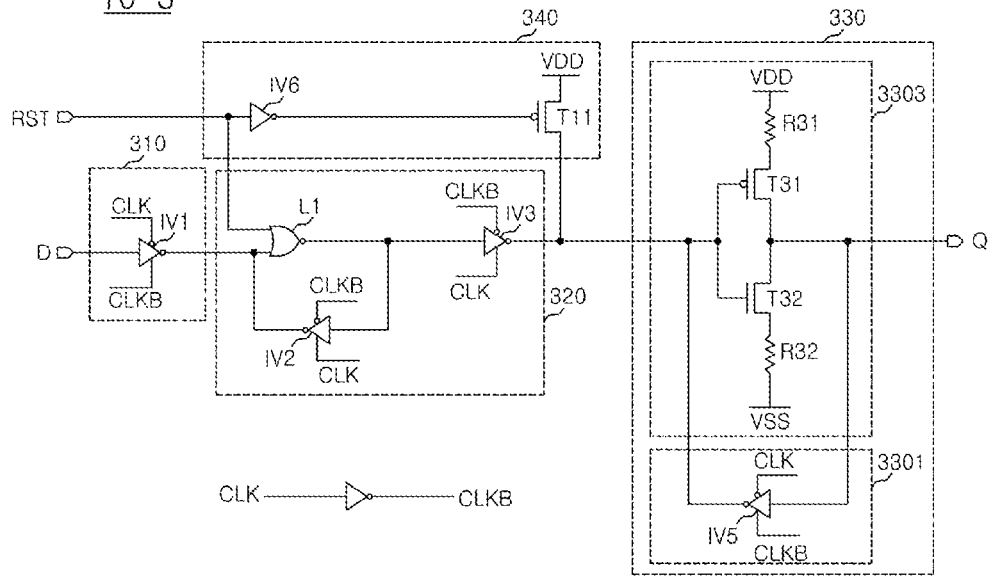
FIG. 12 illustrates an example of the flip-flop circuit according to the embodiment of the present disclosure.

FIG. 12 illustrates an example of a flip-flop circuit according to an embodiment of the present disclosure.

The flip-flop circuit 10-3 according to the embodiment of the present disclosure may include an input unit 310, a driving unit 320, an output unit 330, and a reset unit 340. The output unit 330 may include a feedback unit 3301 and a timing control unit 3303.

In the flip-flop circuit 10-3 according to the embodiment of the present disclosure, the feedback unit 3301 may include a fifth inverter IV5 having an input terminal coupled to an output node Q and an output terminal coupled to an output terminal of the driving unit 320, and the fifth inverter IV5 may be driven according to clock signals CLK and CLKB.

The timing control unit 3303 may include a second resistance element R31, a second switching element T31, a third switching element T32, and a third resistance element R32, which are coupled in series between a power supply voltage VDD terminal and a ground voltage VSS terminal. The second switching element T31 and the third switching element T32 may be driven according to the level of a signal applied to an output terminal of the driving unit 320, and output nodes of the second switching element T31 and the third switching element T32 may be commonly coupled to an output node of the timing control unit 3303.

Thus, the second and third switching elements T31 and T32 may substantially serve as inverters. In the flip-flop circuit illustrated in FIG. 12, the second and third resistance elements R31 and R32 may be provided at a source terminal of the inverter including the second and third switching elements T31 and T32, and serve to delay data output timing.

That is, while the feedback unit 3301 and the second and third switching elements T31 and T32 within the timing control unit 3303 latch signals, the data output timing is controlled by the second and third resistance elements R31 and R32.

The second and third resistance elements R31 and R32 may include an active resistance element or metal resistance element.

Figure 13:
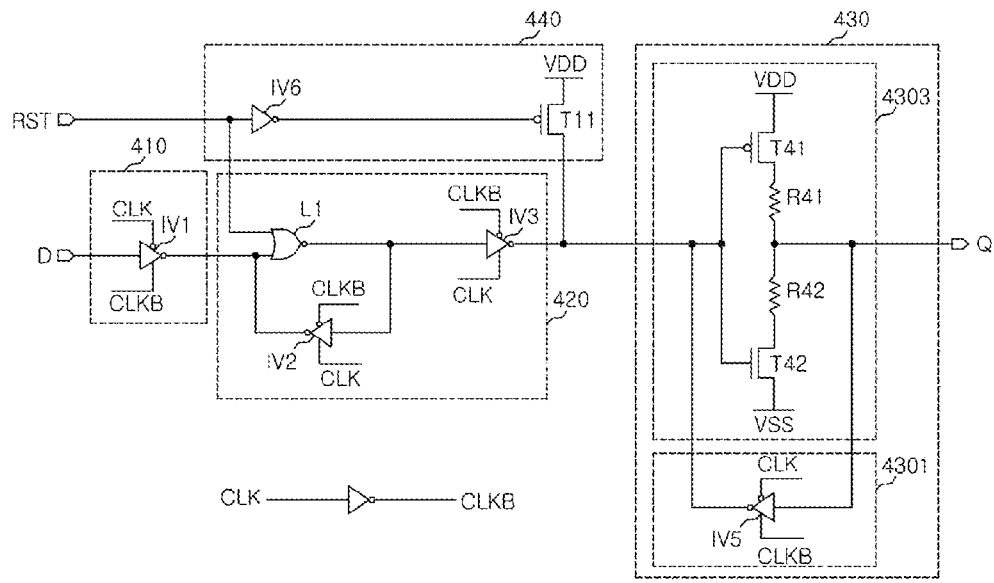
FIG. 13 illustrates an example of the flip-flop circuit according to the embodiment of the present disclosure.

FIG. 13 illustrates an example of a flip-flop circuit according to an embodiment of the present disclosure. The flip-flop circuit of FIG. 13 may be considered as a modification of the flip-flop circuit of FIG. 12.

That is, the flip-flop circuit 10-4 illustrated in FIG. 13 may include an input unit 410, a driving unit 420, an output unit 430, and a reset unit 440, and the reset unit 440 may include a feedback unit 4301 and a timing control unit 4303.

The flip-flip circuit of FIG. 12 is different from the flip-flop circuit of FIG. 13 in that fourth and fifth resistance elements R41 and R42 are provided at drain terminals of the fourth and fifth switching elements T41 and T42, respectively, and control data output timing.

The fourth and fifth resistance elements R41 and R42 may include an active resistance element or metal resistance element.

Figure 14:
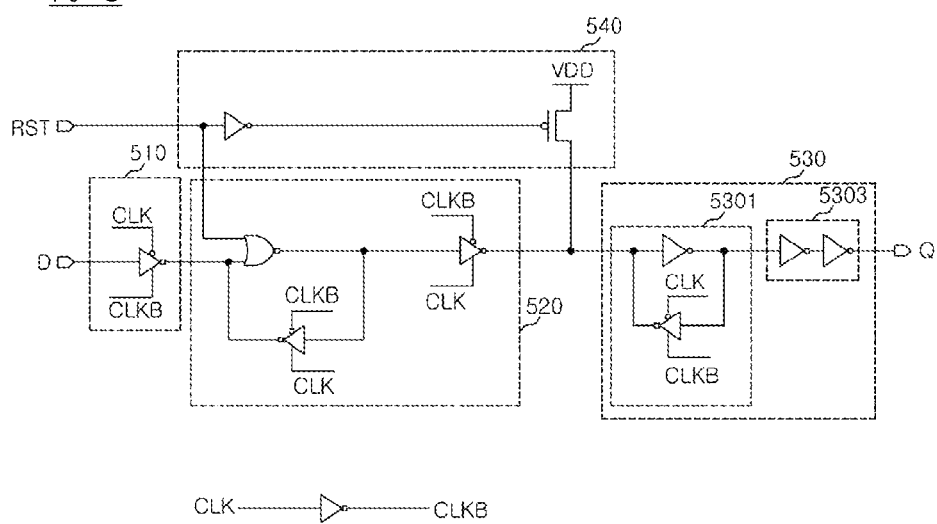
FIG. 14 illustrates an example of the flip-flop circuit according to the embodiment of the present disclosure.

FIG. 14 illustrates an example of a flip-flop circuit according to an embodiment of the present disclosure.

The flip-flop circuit 10-5 illustrated in FIG. 14 may include an input unit 510, a driving unit 520, an output unit 530, and a reset unit 540, and the output unit 530 may include a latch unit 5301 and a timing control unit 5303.

The input unit 510, the driving unit 520, the latch unit 5301, and the reset unit 540 have substantially the same configuration as those of the flip-flop circuit illustrated in FIG. 9.

However, the timing control unit 5303 may be implemented with a delay unit including two-stage inverters to control data output timing.

As the timing control unit 5303 is employed, an output time of data may be delayed by loading of the clock signal. Thus, a setup/hold margin may be improved.

Figure 15:
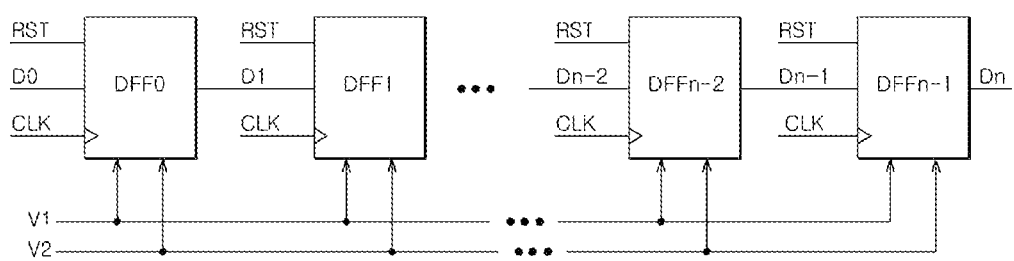
FIG. 15 is a configuration diagram of a semiconductor apparatus according to an embodiment of the present disclosure.

FIG. 15 is a configuration diagram of a semiconductor apparatus according to an embodiment of the present disclosure.

The semiconductor apparatus 100 illustrated in FIG. 15 may include a flip-flop chain circuit having a plurality of flip-flop circuits coupled in series.

Each of the flip-flop circuits DFF0 to DFFn−1 may be configured to generate output data Dx+1 in response to a reset signal RST, input data Dx (i.e., D0, D1, Dn−2, and Dn−1), and a clock signal CLK where x is a natural number ranging from 1 to n (n being a natural number greater than 1), and output timing of the output data Dx+1 (i.e., D1, Dn−2, Dn−1, and Dn) is controlled by a timing control unit which is driven according to first and second bias voltages V1 and V2.

Each of the flip-flop circuits DFF0 to DFFn−1 illustrated in FIG. 15 may correspond to the flip-flop circuit 10-1 illustrated in FIG. 9.

The flip-flop circuit according to the embodiments of the present disclosure delays output timing of data by a delay amount unrelated to a clock signal. When such flip-flop circuits are coupled in series, data delayed and outputted through a previous flip-flop circuit are inputted to a next flip-flop circuit according to the clock signal. Thus, a semiconductor apparatus such as a chain circuit including the flip-flop circuits may secure a setup/hold time margin.

Furthermore, when the timing control unit for controlling data output timing includes transmission switching elements, resistance elements, or inverters, the area occupied by the timing control unit may be reduced, and the delay amount may be controlled to a small value.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A flip-flop circuit comprising:
   a latch unit configured to latch an input signal in response to a clock signal; and
   a timing control unit configured to generate a delay signal by delaying a signal provided from the latch unit by a predetermined time regardless of the clock signal and output the delay signal as a final output data of the flip-flop circuit,
   wherein the timing control unit comprises a transmission switching element configured to be driven by first and second bias voltages and delay the output signal of the latch unit.

2. The flip-flop circuit according to claim 1, further comprising:
   an input unit configured to latch an initial input signal in response to the clock signal; and
   a driving unit configured to latch the signal provided from the input unit in response to the clock signal and output the latched signal as the input signal.

3. The flip-flop circuit according to claim 2, wherein the input unit latches the initial input signal in synchronization with a first phase of the clock signal, the driving unit latches a signal provided from the input unit in synchronization with a second phase of the clock signal, and the latch unit latches the input signal in synchronization with the first phase of the clock signal.

4. A semiconductor apparatus comprising a plurality of flip-flop circuits coupled in series,
   wherein each of the flip-flop circuits comprises:
   a latch unit configured to latch an input signal in response to a clock signal; and
   a timing control unit configured to generate a delay signal by delaying a signal provided from the latch unit by a preset time regardless of the clock signal and output the delay signal as a final output data of the flip-flop circuit, wherein the timing control unit comprises a transmission switching element configured to be driven by first and second bias voltages and delay the output signal of the latch unit.

* * * * *